US012615850B2

(12) United States Patent　　　　　　(10) Patent No.: US 12,615,850 B2
Meng et al.　　　　　　　　　　　　　(45) Date of Patent:　　Apr. 28, 2026

(54) HETEROJUNCTION SOLAR CELL AND METHOD FOR PRODUCING A HETEROJUNCTION SOLAR CELL

(71) Applicant: Trina Solar Co., Ltd, Changzhou (CN)

(72) Inventors: Zibo Meng, Changzhou (CN);
Hongwei Li, Changzhou (CN);
Guangtao Yang, Changzhou (CN);
Xueling Zhang, Changzhou (CN);
Daming Chen, Changzhou (CN)

(73) Assignee: Trina Solar Co., Ltd, Changzhou (CN)

( * ) Notice: Subject to any disclaimer, the term of this patent is extended or adjusted under 35 U.S.C. 154(b) by 4 days.

(21) Appl. No.: 18/685,615

(22) PCT Filed: Jul. 21, 2023

(86) PCT No.: PCT/CN2023/108516

§ 371 (c)(1),
(2) Date: Feb. 22, 2024

(87) PCT Pub. No.: WO2024/103818

PCT Pub. Date: May 23, 2024

(65) Prior Publication Data

US 2025/0248133 A1　　Jul. 31, 2025

(30) Foreign Application Priority Data

Nov. 14, 2022　　(CN) .......................... 202211419460.9

(51) Int. Cl.
*H10F 10/164* 　　(2025.01)
*H10F 71/00* 　　(2025.01)
(Continued)

(52) U.S. Cl.
CPC ......... *H10F 10/164* (2025.01); *H10F 71/103* (2025.01); *H10F 71/129* (2025.01); *H10F 77/244* (2025.01); *H10F 77/315* (2025.01)

(58) Field of Classification Search
None
See application file for complete search history.

(56) References Cited

U.S. PATENT DOCUMENTS

2010/0059110 A1* 　3/2010　Sheng ................... H10F 71/121
　　　　　　　　　　　　　　　　　　　136/258
2012/0291860 A1 　11/2012　Park et al.
(Continued)

FOREIGN PATENT DOCUMENTS

CN　　　102956756 A　　3/2013
CN　　　102171384 B　　12/2013
(Continued)

OTHER PUBLICATIONS

Machine Translation of CN102956756A, 8 pages, (Mar. 6, 2013).
(Continued)

*Primary Examiner* — Tamir Ayad
(74) *Attorney, Agent, or Firm* — HOVEY WILLIAMS LLP

(57)　　　　ABSTRACT

This application provides a heterojunction solar cell and a preparation method. The heterojunction solar cell includes: a silicon substrate being n-type or p-type doped, and having a front surface and a back surface opposite to each other; a first passivation layer and a second passivation layer sequentially located on the front surface of the silicon substrate; a third passivation layer and a fourth passivation layer sequentially located on the back surface of the silicon substrate; a silicon oxycarbide layer located on a surface of the fourth passivation layer away from the silicon substrate, wherein the silicon oxycarbide layer is n-type or p-type doped to form PN junction with the silicon substrate, an atomic percentage of carbon is greater than an atomic percentage of oxygen in the silicon oxycarbide layer. The heterojunction solar cell of the present application improves the performance of the solar cell. The carbon and the oxygen in the
(Continued)

100 silicon oxycarbide layer have a fixed effect on the hydrogen, which is beneficial for reducing the loss of hydrogen.

6 Claims, 2 Drawing Sheets

(51) Int. Cl.

| | | |
|---|---|---|
| *H10F 71/10* | (2025.01) | |
| *H10F 77/20* | (2025.01) | |
| *H10F 77/30* | (2025.01) | |

(56) References Cited

U.S. PATENT DOCUMENTS

| | | | |
|---|---|---|---|
| 2013/0112264 A1 | 5/2013 | Wang et al. | |
| 2015/0068591 A1 | 3/2015 | Chan et al. | |
| 2015/0075600 A1 | 3/2015 | Hekmatshoartabari et al. | |
| 2020/0075789 A1 | 3/2020 | Loper et al. | |
| 2021/0273128 A1* | 9/2021 | Cho ..................... | G06F 1/1684 |
| 2023/0178664 A1* | 6/2023 | Wang ................... | H10F 77/311 |
| | | | 136/256 |

FOREIGN PATENT DOCUMENTS

| | | | |
|---|---|---|---|
| CN | 104952943 A | 9/2015 | |
| CN | 112768549 A | 5/2021 | |
| CN | 112802910 A | 5/2021 | |
| CN | 113345969 A | 9/2021 | |
| CN | 215220730 U | 12/2021 | |
| EP | 4071830 A1 | 10/2022 | |
| JP | 2001044456 A | 2/2001 | |
| JP | 2007227692 A | 9/2007 | |
| JP | 2012216593 A | 11/2012 | |
| JP | 2014049675 A | 3/2014 | |
| JP | 2015532787 A | 11/2015 | |
| WO | 2011032272 A1 | 3/2011 | |
| WO | 2022144209 A1 | 7/2022 | |

OTHER PUBLICATIONS

Notice of Allowance (Original Chinese) dated Aug. 29, 2024 in corresponding Chinese Patent Application 2022114194609, 4 pages.
Notice of Allowance (English Translation) dated Aug. 29, 2024 in corresponding Chinese Patent Application 2022114194609, 4 pages.
Written Opinion (with English Translation) dated Oct. 7, 2023 in corresponding PCT Patent Application PCT/CN2023/108516, 9 pages.
International Search Report (with English Translation) dated Oct. 7, 2023 in corresponding PCT Patent Application PCT/CN2023/108516, 5 pages.
Machine Translation of CN112768549A, 10 pages, (May 7, 2021).
Machine Translation of CN113345969A, 10 pages, (Sep. 3, 2021).
Machine Translation of JP2014049675A, 6 pages, (Mar. 17, 2014).
Machine Translation of JP2012216593A, 8 pages, (Nov. 8, 2012).
Machine Translation of JP2007227692A, 10 pages, (Sep. 6, 2007).
Machine Translation of JP2001044456A, 8 pages, (Feb. 16, 2001).
Examination Report dated Feb. 25, 2024 in corresponding Australian Patent Application No. 2023278064, 5 pages.
Machine Translation of CN102171384, 27 pages, (Dec. 25, 2013).
Search Report dated Mar. 6, 2025 in corresponding European Patent Application No. 23813259, 12 pages.
Machine Translation of CN215220730U, 15 pages, (Dec. 17, 2021).
Machine Translation of CN104952943A, 32 pages, (Sep. 30, 2015).
D. W. Kang et al., "Wide-bandgap p-type microcrystalline silicon oxycarbide using additional trimethylboron for silicon heterojunction solar cells," Progress in Photovoltaics Research and Applications, vol. 15, pp. 659-676, 2017, 6 pages.
Office Action (Original Japanese) dated Jun. 10, 2025 in corresponding Japanese Patent Application No. 2023574673, 4 pages.
Office Action (English Translation) dated Jun. 10, 2025 in corresponding Japanese Patent Application No. 2023574673, 4 pages.
Machine Translation of CN112802910A, 12 pages, (original document publication year 2021).
Machine Translation of JP2015532787A, 9 pages, (original document publication year 2015).

* cited by examiner

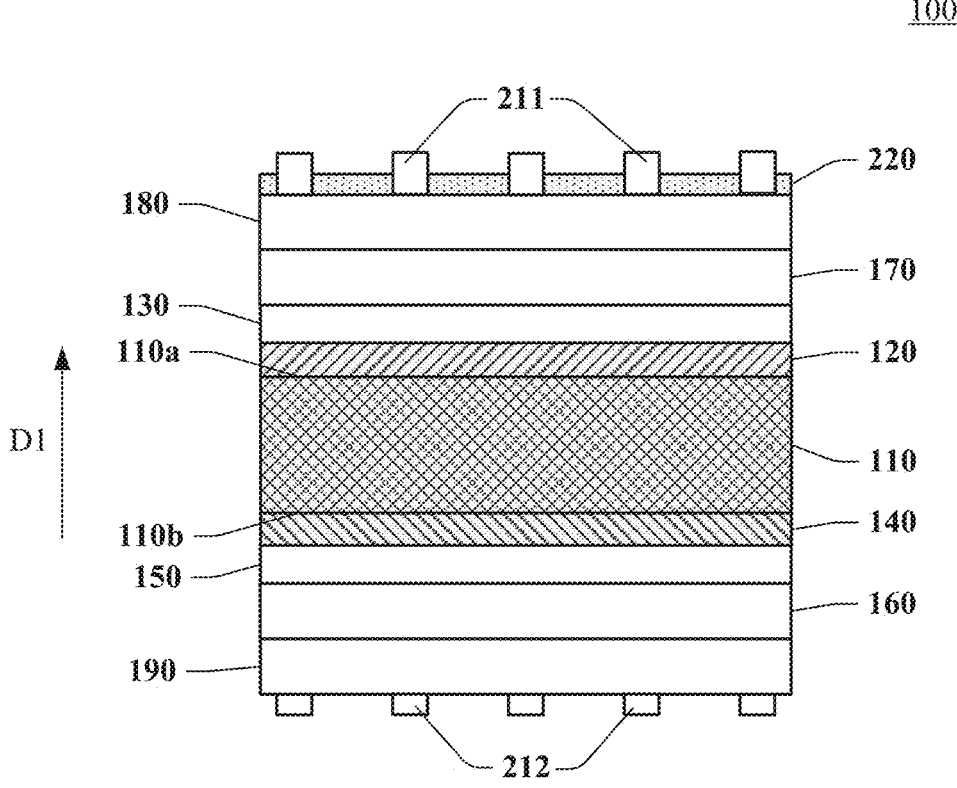
FIG.     1

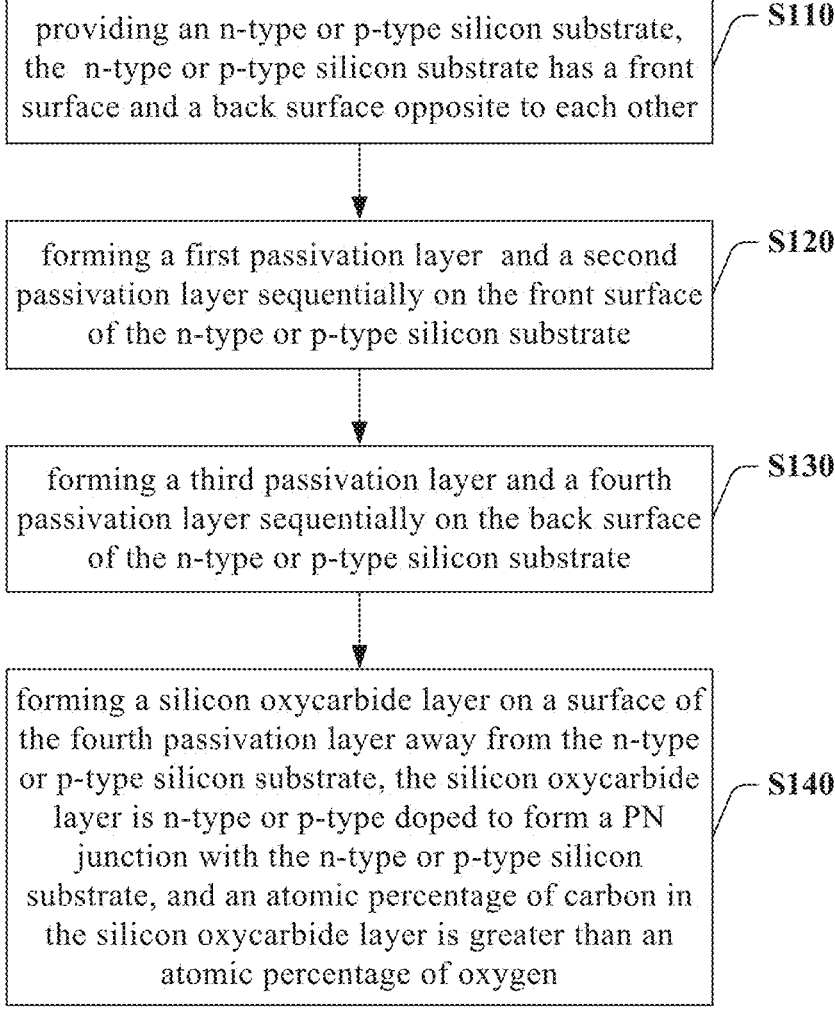

providing an n-type or p-type silicon substrate, the n-type or p-type silicon substrate has a front surface and a back surface opposite to each other ⌐ S110 forming a first passivation layer and a second passivation layer sequentially on the front surface of the n-type or p-type silicon substrate ⌐ S120 forming a third passivation layer and a fourth passivation layer sequentially on the back surface of the n-type or p-type silicon substrate ⌐ S130 forming a silicon oxycarbide layer on a surface of the fourth passivation layer away from the n-type or p-type silicon substrate, the silicon oxycarbide layer is n-type or p-type doped to form a PN junction with the n-type or p-type silicon substrate, and an atomic percentage of carbon in the silicon oxycarbide layer is greater than an atomic percentage of oxygen ⌐ S140

FIG.   2

HETEROJUNCTION SOLAR CELL AND METHOD FOR PRODUCING A HETEROJUNCTION SOLAR CELL

RELATED APPLICATIONS

This application is the National Stage of International Patent Application No. PCT/CN2023/108516, filed Jul. 21, 2023, which is hereby incorporated by reference in its entirety, and which claims priority to Chinese Patent Application No. 202211419460.9, filed Nov. 14, 2022.

TECHNICAL FIELD

The present application mainly relates to the field of photovoltaics, specifically to a heterojunction solar cell and a method for producing a heterojunction solar cell.

BACKGROUND

Silicon-based heterojunction solar cell is one of the current mainstream high-efficiency solar cell technologies, which has the advantages of simple structure, high conversion efficiency, and low-temperature coefficient, and is one of the important directions for the development of solar cells. The structure and process flow of silicon-based heterojunction solar cell is relatively simple. Silicon-based heterojunction solar cell uses n-type or p-type doped silicon substrate as the base layer, forms an intrinsic amorphous silicon layer, p-type or n-type amorphous silicon layer on one surface of the silicon substrate, and forms an intrinsic amorphous silicon layer and an n-type amorphous silicon layer on the other surface of the silicon substrate. Wherein, the p-type or n-type amorphous silicon layer forms a PN junction with the n-type or p-type doped silicon substrate.

In silicon-based heterojunction solar cell in the prior art, the p-type doped layer is amorphous silicon doped with boron. However, due to the upper limit of the doping amount, the doping efficiency of the p-type doped layer is low, which weakens the electric field at the PN junction on the back of the cell, results in increased recombination of photogenerated carriers, and ultimately results in lower efficiency of the solar cell.

Therefore, how to increase the upper limit of dopant and improve the efficiency of the solar cell is an urgent problem to be solved.

SUMMARY

In view of the above defects, the purpose of the present application is to propose a heterojunction solar cell and a method for producing a heterojunction solar cell, and the heterojunction solar has the advantages of high doping limit and high efficiency.

In order to achieve this purpose, the present disclosure proposes the following technical solutions: a heterojunction solar cell, comprising: a silicon substrate being n-type or p-type doped, and having a front surface and a back surface opposite to each other; a first passivation layer and a second passivation layer sequentially located on the front surface of the silicon substrate; a third passivation layer and a fourth passivation layer sequentially located on the back surface of the silicon substrate; a silicon oxycarbide layer located on a surface of the fourth passivation layer away from the silicon substrate, wherein the silicon oxycarbide layer is n-type or p-type doped to form a PN junction with the silicon substrate, and an atomic percentage of carbon is greater than an atomic percentage of oxygen in the silicon oxycarbide layer.

In one embodiment, the first passivation layer is hydrogenated amorphous silicon oxide, and the second passivation layer is hydrogenated nanocrystalline silicon.

In one embodiment, the third passivation layer is hydrogenated amorphous silicon, and the fourth passivation layer is hydrogenated nanocrystalline silicon.

In one embodiment, the silicon substrate is n-type doped, and the silicon oxycarbide layer is p-type doped.

In one embodiment, the heterojunction solar cell further comprises a fifth passivation layer located on a surface of the second passivation layer away from the silicon substrate, wherein a material of the fifth passivation layer is hydrogenated n-type microcrystalline silicon or nanocrystalline silicon oxycarbide.

In one embodiment, the heterojunction solar cell further comprises a first transparent conductive oxide film and a second transparent conductive oxide film, wherein the first transparent conductive oxide film locates on a surface of the fifth passivation layer away from the silicon substrate, and the second transparent conductive oxide film locates on a surface of the fourth passivation layer away from the silicon substrate.

In one embodiment, the heterojunction solar cell further comprises an anti-reflection film located on a surface of the first transparent conductive oxide film away from the silicon substrate.

In one embodiment, the heterojunction solar cell further comprises a first electrode and a second electrode contacting with the first transparent conductive oxide film and the second transparent conductive oxide film respectively, wherein the first electrode and/or the second electrode are manufactured by electroplating or chemical-plating.

In one embodiment, the atomic percentage of carbon in the silicon oxycarbide layer is equal to or greater than 7 times the atomic percentage of oxygen.

The present disclosure also proposes a method for producing a heterojunction solar cell, comprising: providing an n-type or p-type silicon substrate having a front surface and a back surface opposite to each other; forming a first passivation layer and a second passivation layer sequentially on the front surface of the n-type or p-type silicon substrate; forming a third passivation layer and a fourth passivation layer sequentially on the back surface of the n-type or p-type silicon substrate; and forming a silicon oxycarbide layer on a surface of the fourth passivation layer away from the n-type or p-type silicon substrate, wherein the silicon oxycarbide layer is n-type or p-type doped to form a PN junction with n-type or p-type silicon substrate, and an atomic percentage of carbon in the silicon oxycarbide layer is greater than an atomic percentage of oxygen.

The heterojunction solar cell of the present application uses a doped silicon oxycarbide layer and an n-type or p-type silicon substrate to form a PN junction, which increases the doping limit of the dopant in the silicon oxycarbide layer, thereby improving the performance of the solar cell. Carbon and oxygen in the silicon oxycarbide layer have a fixed effect on the hydrogen, which is beneficial for reducing the loss of hydrogen.

DESCRIPTION OF THE DRAWINGS

In order to make the above purposes, features, and advantages of the present disclosure more obvious and understandable, the specific embodiments of the present disclosure are described in detail below with reference to the accompanying drawings, wherein:

FIG. 1 is a schematic cross-sectional view of a hetero-junction solar cell according to an embodiment of the present application;

FIG. 2 is an exemplary flow chart of a method for producing a heterojunction solar cell according to an embodiment of the present application.

PREFERRED EMBODIMENT OF THE PRESENT INVENTION

In order to make the above objects, features, and advantages of the present disclosure more obvious and understandable, the specific embodiments of the present disclosure are described in detail below with reference to the accompanying drawings.

Many specific details are set forth in the following description to fully understand the present disclosure, but the present disclosure can also be implemented in other ways different from those described here, so the present disclosure is not limited by the specific embodiments disclosed below.

As shown in this disclosure and claims, words such as "a", "an", "an" and/or "the" do not specifically refer to the singular and may include the plural unless the context clearly indicates an exception. Generally speaking, the terms "comprising" and "comprising" only imply the inclusion of clearly identified steps and elements, and these steps and elements do not constitute an exclusive list. The method or apparatus may also include other steps or elements.

In addition, it should be noted that the use of words such as "first" and "second" to define parts is only to facilitate the distinction between corresponding parts. Unless otherwise stated, the above words have no special meaning and therefore cannot be understood. To limit the scope of protection of this disclosure. In addition, although the terms used in this disclosure are selected from well-known and commonly used terms, some terms mentioned in the specification of this disclosure may be selected by the applicant based on his or her judgment, and their detailed meanings are set out herein, their detailed meanings stated in the relevant section of the description. Furthermore, the disclosure is required to be understood not merely by the actual terms used, but also by the meaning connoted by each term.

Flowcharts are used in this disclosure to illustrate operations performed by systems according to embodiments of this disclosure. It should be understood that the preceding or following operations are not necessarily performed in exact order. Instead, the various steps can be processed in reverse order or simultaneously. And, other operations may be added to these processes, or a step or steps may be removed from these processes.

The PN junction in a heterojunction solar cell consists of a doped silicon substrate and a material layer on one surface of the silicon substrate that is doped with a dopant of opposite polarity to the dopant in the silicon substrate. In conventional technology, the upper limit of doping in the material layer is relatively low. A heterojunction solar cell of the present application has the advantage of a high upper limit of doping.

The heterojunction solar cell of the present disclosure will be described below through specific embodiments.

FIG. 1 is a schematic cross-sectional view of a hetero-junction solar cell according to an embodiment of the present application. Referring to FIG. 1, the heterojunction solar cell 100 includes a silicon substrate 110, a first passivation layer 120, a second passivation layer 130, a third passivation layer 140, a fourth passivation layer 150, and a silicon oxycarbide layer 160.

Specifically, as shown in FIG. 1, the silicon substrate 110 is subjected to n-type or p-type doping. The material of the silicon substrate 110 includes single crystal silicon and/or polycrystalline silicon. Phosphorus (P) can be doped into the single crystal silicon through a doping process to form an n-type silicon substrate 110, or boron (B) can be doped into the single crystal silicon to a p-type silicon substrate 110. It can be understood that the doping elements in the silicon substrate 110 are not limited to the above-mentioned phosphorus and boron, and may also be other elements that are capable of forming n-type and p-type silicon substrate.

Furthermore, the silicon substrate 110 is not limited to any specific size and shape. The silicon substrate 110 may be a circular substrate having a diameter of 200 mm, a diameter of 300 mm, or other diameters such as 450 mm, etc. As needed, the silicon substrate 110 can also be polygonal, square, rectangular, curved, or other non-circular workpiece, such as a polygonal silicon substrate.

Referring to FIG. 1, the silicon substrate 110 has a front surface 110a and a back surface 110b opposite to each other along the thickness direction D1. The front surface 110a refers to a surface of the silicon substrate 110 facing upward in FIG. 1.

In one embodiment, the silicon substrate 110 is an n-type doped silicon substrate. For convenience of description, unless otherwise specified, the silicon substrate 110 in the following is an n-type doped silicon substrate.

Continuing to refer to FIG. 1, the first passivation layer 120 is disposed on the front surface 111a of the silicon substrate 110, and the second passivation layer 130 is disposed on a surface of the first passivation layer 120 away from the silicon substrate 110 along the thickness direction D1, that is, the first passivation layer 120 and the second passivation layer 130 are sequentially disposed on the front surface 110a of the silicon substrate 110. The method of sequentially disposing the first passivation layer 120 and the second passivation layer 130 on the front surface 110a of the silicon substrate 110 includes using very high-frequency plasma enhanced chemical vapor deposition (VHF-PECVD) to deposit the first passivation layer 120 and the second passivation layer 130 on the front surface 110a of the silicon substrate 110 in sequence, wherein the thickness of the first passivation layer 120 is 0.8-1.5 nm, and the thickness of the second passivation layer 130 is 3-4 nm. In some embodiments, before forming the first passivation layer 120, the silicon substrate 110 is also subjected to a destructive cleaning process and a texturing process. The destructive cleaning process can remove damages of the front surface 110a and the back surface 110b of the silicon substrate 110, and the texturing process can form a pyramid texture, thereby reducing the reflectivity of the silicon substrate 110 to light.

In one embodiment, the first passivation layer is a hydro-genated amorphous silicon oxide, and the second passivation layer is a hydrogenated nanocrystalline silicon. Compared with single crystal silicon oxide and amorphous silicon oxide, using the hydrogenated amorphous silicon oxide as the first passivation layer is beneficial for increasing the hydrogen content in the first passivation layer, which can improve the passivation performance of the first passivation layer and reduce a growth probability of interfacial epitaxial crystals, thereby increasing the photocurrent density of the solar cell. In addition, the oxygen in the first passivation layer can form a hydrogen bond with the hydrogen, thereby preventing the hydrogen from diffusing out of the first passivation layer. The conductivity of the second passivation layer using nanocrystalline silicon is better than that of a second passivation layer using amorphous silicon, so using nanocrystalline silicon as the second passivation layer can reduce the resistivity of the second passivation layer and increase the fill factor (FF) of the solar cell. The combination of the first passivation layer and the second passivation layer can achieve an excellent passivation effect while ensuring that the conductivity of the passivation layer meets the requirements. In some embodiments, the size of the nanocrystalline silicon in the second passivation layer is 2-5 nm, and the crystallization rate of the second passivation layer is 10%-70%. Among them, "hydrogenated" refers to the introduction of hydrogen atoms (H) into the material layer (such as the first passivation layer, and the second passivation layer). These hydrogen atoms can neutralize dangling bonds and defects in the material layer, thereby reducing the recombination of carriers and improving the efficiency of the solar cell. Unless otherwise specified, the above explanation of "hydrogenated" also applies to the following paragraphs, and will not be repeated as such.

In another embodiment, referring to FIG. 1, the solar cell 100 further comprises a fifth passivation layer 170 disposed on a surface of the second passivation layer 130 away from the silicon substrate 110, and the material of the fifth passivation layer 170 is a hydrogenated n-type microcrystalline silicon oxycarbide or a nanocrystalline silicon oxycarbide. When the silicon oxycarbide in the fifth passivation layer 170 is microcrystalline silicon oxycarbide, its grain size is 10-100 nm. The atomic percentage of the oxygen in the fifth passivation layer may be greater than, equal to, or less than the atomic percentage of the carbon. The fifth passivation layer 170 has the functions of electron transport and field passivation, thereby helping to improve the performance of the solar cell.

In some embodiments, the method of manufacturing the fifth passivation layer 170 includes using very high-frequency plasma chemical vapor deposition (VHF-PECVD) to deposit the fifth passivation on a surface of the second passivation layer 130 away from the silicon substrate 110, and the thickness of the fifth passivation layer 170 is 10-20 nm. In the previous embodiment, the material used for the second passivation layer 130 is hydrogenated nanocrystalline silicon. The hydrogenated nanocrystalline silicon on a surface in contact with the fifth passivation layer 130 can be used as a seed layer of the n-type microcrystalline silicon oxycarbide or the nanocrystalline silicon oxycarbide in the fifth passivation layer, which is beneficial for improving the crystallization rate of the fifth passivation layer.

Back to FIG. 1, the third passivation layer 140 is located on the back surface 110*b* of the silicon substrate 110, and the fourth passivation layer 150 is located on a surface of the third passivation layer 140 away from the silicon substrate 110, that is, the third passivation layer 140 and the fourth passivation layer 150 are sequentially formed on the back surface 110*b* of the silicon substrate 110. In some embodiments, the method of manufacturing the third passivation layer 140 and the fourth passivation layer 150 may be the same as the first passivation layer 120 and the second passivation layer 130, wherein the thickness of the third passivation layer 140 is 5-10 nm, and the thickness of the fourth passivation layer 150 is 3-4 nm.

In one embodiment, the third passivation layer is a hydrogenated amorphous silicon, and the fourth passivation layer is a hydrogenated nanocrystalline silicon. Compared with using hydrogenated nanocrystalline silicon as the material of the third passivation layer, using amorphous silicon helps to increase the hydrogen content in the third passivation layer, thereby improving the passivation effect. Since high-concentration hydrogen plasma has an etching effect on amorphous silicon during the process, the thickness of the third passivation layer may be smaller than the designed thickness. Therefore, nanocrystalline silicon is used as the material of the fourth passivation layer, which assists passivation effect, and ensures the passivation effect. In some embodiments, the size of the nanocrystalline silicon in the fourth passivation layer is 2-5 nm, and the crystallization rate of the fourth passivation layer is 10%-70%.

Continuing to refer to FIG. 1, the silicon oxycarbide layer 160 is disposed on the surface of the fourth passivation layer 150 away from the silicon substrate 110. Wherein, the silicon oxycarbide layer 160 is n-type or p-type doped to form a PN junction with the silicon substrate 110. The atomic percentage of carbon in the silicon oxycarbide layer 160 is greater than the atomic percentage of oxygen. As mentioned above, the silicon substrate 110 can be an n-type silicon substrate or a p-type silicon substrate. When the silicon substrate 110 is an n-type silicon substrate, the silicon oxycarbide layer 160 is a p-type silicon oxycarbide layer to form a PN junction with the silicon substrate 110; on the contrary, the silicon oxycarbide layer 160 is an n-type doped silicon oxycarbide layer. For convenience of description, the silicon oxycarbide layer 160 in the following description is p-type doped. In some embodiments, the method of forming the silicon oxycarbide layer 160 is the same as the fourth passivation layer, wherein the thickness of the silicon oxycarbide layer 160 is 5-10 nm, and the silicon oxycarbide can be a microcrystalline silicon oxycarbide or a nanocrystalline silicon oxycarbide. When the silicon oxycarbide is the microcrystalline silicon oxycarbide, its grain size is 10-100 nm, and when the silicon oxycarbide is the nanocrystalline silicon oxycarbide, its grain size is 2-5 nm In conventional technology, amorphous silicon is usually doped with boron to obtain a p-type doping layer, but the doping activation rate is low, so the doping amount needs to be increased to increase the doping activation rate, but this may result in excessive doping, thereby resulting in a dead layer. In addition, when microcrystalline silicon is doped with boron to obtain a p-type doped layer, the upper limit of doping of boron in the microcrystalline silicon is relatively low. The doping of the silicon oxycarbide in the present application can effectively solve the above problems. Since carbon and silicon are homologous elements, the carbon can be efficiently incorporated into the silicon film structure during the preparation process to form a stable carbon-silicon compound, which can improve the optical band gap of solar cells. In addition, the addition of oxygen can further increase the optical band gap, and both oxygen and carbon have the function of fixing hydrogen, which can reduce the loss of hydrogen, the loss of hydrogen would increase the internal defect density of the silicon oxycarbide layer 160. And, the doping limit of the silicon oxycarbide is high, so it is difficult to form the dead layer. Besides, microcrystallization can also increase the doping activation concentration. Therefore, the use of the p-type hydrogenated doped microcrystalline silicon oxycarbide can improve the performance of the silicon-based heterojunction solar cell. On the basis of using silicon oxycarbide as the p-type layer, the present application further limits the carbon content in the silicon oxycarbide layer to be greater than the oxygen content, so that more carbon-silicon bonds can be formed in the silicon oxycarbide layer. On the one hand, compared with silicon oxide, silicon carbide has a wider band gap and a higher upper limit of doping, thereby improving the doping amount and the performance of the solar cell. On the other hand, when the doping element in the silicon oxycarbide layer is boron, the oxygen in the silicon oxycarbide layer combines with the boron to form a boron-oxygen pair, which decays the solar cell. Therefore, reducing the content of oxygen is beneficial for reducing the combination of boron and oxygen. In some other embodiments, the atomic percentage of carbon in the silicon oxycarbide layer is equal to or greater than 7 times the atomic percentage of oxygen. In this way, it can be ensured that the doping amount in the silicon oxycarbide layer meets the requirements.

In one embodiment, the solar cell further includes a first transparent conductive oxide film and a second transparent conductive oxide film. As shown in FIG. 1, the first transparent conductive oxide film 180 is disposed on a surface of the fifth passivation layer 170 away from the silicon substrate 110, and the second transparent conductive oxide film 190 is disposed on a surface of the fourth passivation layer 160 away from the silicon substrate 110. In some embodiments, a method for producing a transparent conductive oxide film includes using physical vapor deposition (PVD) and reactive plasma deposition (RPD), wherein the thickness of the first transparent conductive oxide film 180 and the thickness of the second transparent conductive oxide film 190 is 60-80 nm. It should be noted that the thicknesses of the first transparent conductive oxide film 180 and the thicknesses of the second transparent conductive oxide film 190 may or may not be equal.

Referring to FIG. 1, in another embodiment, the solar cell 100 further includes a first electrode 211 and a second electrode 212. Wherein the first electrode 211 and the second electrode 212 are in contact with the first transparent conductive oxide film 180 and the second transparent conductive oxide film 190 respectively. The first transparent conductive oxide film 180 can prevent the first electrode 211 from being in direct contact with the fifth passivation layer 170, and the second transparent conductive oxide film 190 can prevent the second electrode 212 from being in direct contact with the silicon oxycarbide layer 160, thereby preventing the resistance from increasing significantly.

In some embodiments, the method of manufacturing the first electrode and the second electrode includes electroplating or chemical plating, and the material of the first electrode and the second electrode includes one or more of copper, aluminum, nickel and tin. Compared with screen printing silver electrodes, manufacturing non-silver electrodes through electroplating or chemical plating has the advantage of low cost.

As shown in FIG. 1, in one embodiment, the solar cell 100 further includes an anti-reflection film 220 disposed on a surface of the first transparent conductive oxide film 180 away from the silicon substrate 110. In some embodiments, the number of the anti-reflection films is not limited to one layer in FIG. 1, for example, there may also be two layers, three layers, or any other number. The material of the anti-reflection film includes but is not limited to one or more of silicon nitride, silicon oxide, magnesium fluoride, and titanium oxide. The anti-reflection film 220 of the solar cell can reflect incident light, thereby improving the utilization rate of the incident light.

The solar cell in the above embodiments uses the doped silicon oxycarbide layer and the silicon substrate to form a PN junction and limits the atomic percentage of carbon in the silicon oxycarbide layer to be greater than the atomic percentage of oxygen. Therefore, the upper limit of doping of the dopant in the silicon oxycarbide layer is increased, thereby improving the performance of the solar cell. Besides, the carbon and the oxygen in the silicon oxycarbide layer have a fixed effect on the hydrogen, which is beneficial for reducing the loss of the hydrogen.

On the other hand, the present application also proposes a method for producing a heterojunction solar cell. Referring to the exemplary flow chart of the method for producing a heterojunction solar cell in an embodiment of the present application shown in FIG. 2 and FIG. 1 together, the method includes the following steps.

Step S110: providing an n-type or p-type silicon substrate 110, the n-type or p-type silicon substrate 110 has a front surface 110a and a back surface 110b opposite to each other;

Step S120: forming a first passivation layer 120 and a second passivation layer 130 sequentially on the front surface 110a of the n-type or p-type silicon substrate 110;

Step S130: forming a third passivation layer 140 and a fourth passivation layer 150 sequentially on the back surface 110b of the n-type or p-type silicon substrate 110;

Step S140: forming a silicon oxycarbide layer 160 on a surface of the fourth passivation layer 150 away from the n-type or p-type silicon substrate 110, the silicon oxycarbide layer 160 is n-type or p-type doped to form a PN junction with the n-type or p-type silicon substrate 110, and an atomic percentage of carbon in the silicon oxycarbide layer 160 is greater than an atomic percentage of oxygen.

Other details about the method for producing the heterojunction solar cell of the present application, please refer to the relevant descriptions above, and will not be repeated as such.

The method in the above embodiment uses the doped silicon oxycarbide layer and the n-type or p-type silicon substrate to form a PN junction and limits the atomic percentage of carbon in the silicon oxycarbide layer to be greater than the atomic percentage of oxygen, which increases the upper limit of doping of the dopant in the silicon oxycarbide layer, thereby improving the performance of the solar cell. The carbon and oxygen have a fixed effect on the hydrogen in the silicon oxycarbide layer, which is beneficial for reducing the loss of hydrogen.

The basic concepts have been described above. Obviously, for those skilled in the art, the above disclosure disclosures are only embodiments and do not constitute limitations to the present disclosure. Although not explicitly stated herein, those skilled in the art may make various modifications, improvements, and corrections to this disclosure. Such modifications, improvements, and corrections are suggested in this disclosure, so such modifications, improvements, and corrections still fall within the spirit and scope of the exemplary embodiments of this disclosure.

And, this disclosure uses specific words to describe the embodiments of the disclosure. For example, "one embodiment", "an embodiment", and/or "some embodiments" means a certain feature, structure, or characteristic related to at least one embodiment of the present disclosure. Therefore, it should be emphasized and noted that "one embodiment" or "an embodiment" or "an alternative embodiment" mentioned twice or more at different places in this specification does not necessarily refer to the same embodiment. In addition, certain features, structures or characteristics in one or more embodiments of the present disclosure may be appropriately combined.

In some embodiments, numbers are used to describe the quantities of components and properties. It should be understood that such numbers used to describe the embodiments are modified by the modifiers "about", "approximately" or "substantially" in some embodiments. Grooming. Unless otherwise stated, "about," "approximately," or "substantially" means that the stated number is allowed to vary by +20%. Accordingly, in some embodiments, the numerical parameters used in the specification and claims are approximations that may vary depending on the desired features of the individual embodiment. In some embodiments, numerical parameters should account for the specified number of significant digits and use general digit preservation methods. Although the numerical fields and parameters used to confirm the breadth of the ranges in some embodiments of the present disclosure are approximations, in specific embodiments, such numerical values are set as accurately as feasible.

The invention claimed is:

1. A heterojunction solar cell, comprising:
a silicon substrate being n-type doped, and having a front surface and a back surface opposite to each other;
a first passivation layer and a second passivation layer sequentially located on the front surface of the silicon substrate;
a third passivation layer located on and in contact with the back surface, wherein the third passivation layer includes hydrogenated amorphous silicon;
a fourth passivation layer located on and in contact with a surface of the third passivation layer away from the silicon substrate, wherein the fourth passivation layer includes hydrogenated nanocrystalline silicon; a fifth passivation layer located on a surface of the second passivation layer away from the silicon substrate, wherein a material of the fifth passivation layer is hydrogenated n-type microcrystalline silicon or nanocrystalline silicon oxycarbide;
a silicon oxycarbide layer located on and in contact with a surface of the fourth passivation layer away from the silicon substrate, wherein the silicon oxycarbide layer is p-type doped to form a PN junction with the silicon substrate, a dopant of the silicon oxycarbide layer includes boron, wherein the atomic percentage of carbon in the silicon oxycarbide layer is equal to or greater than 7 times the atomic percentage of oxygen in the silicon oxycarbide layer.

2. The solar cell of claim 1, wherein the first passivation layer is hydrogenated amorphous silicon oxide, and the second passivation layer is hydrogenated nanocrystalline silicon.

3. The solar cell of claim 1, further comprising a first transparent conductive oxide film and a second transparent conductive oxide film, wherein the first transparent conductive oxide film is located on a surface of the fifth passivation layer away from the silicon substrate, and the second transparent conductive oxide film is located on a surface of the silicon oxycarbide layer away from the silicon substrate.

4. The solar cell of claim 3, further comprising an anti-reflection film located on a surface of the first transparent conductive oxide film away from the silicon substrate.

5. The solar cell of claim 3, further comprising a first electrode and a second electrode contacting with the first transparent conductive oxide film and the second transparent conductive oxide film respectively, wherein the first electrode and/or the second electrode are manufactured by electroplating or chemical-plating.

6. A method for producing a heterojunction solar cell comprising:
providing an n-type silicon substrate having a front surface and a back surface opposite to each other;
forming a first passivation layer and a second passivation layer sequentially on the front surface of the n-type silicon substrate;
forming a third passivation layer, wherein the third passivation layer is located on and in contact with the back surface, the third passivation layer includes hydrogenated amorphous silicon;
forming a fourth passivation layer, wherein the fourth passivation layer is located on and in contact with a surface of the third passivation layer away from the n-type silicon substrate, the fourth passivation layer includes hydrogenated nanocrystalline silicon; forming a fifth passivation layer located on a surface of the second passivation layer away from the n-type silicon substrate, wherein a material of the fifth passivation layer is hydrogenated n-type microcrystalline silicon or nanocrystalline silicon oxycarbide; and
forming a silicon oxycarbide layer on a surface of the fourth passivation layer away from the n-type silicon substrate, wherein the silicon oxycarbide layer is in contact with the surface of the fourth passivation layer away from the n-type silicon substrate, the silicon oxycarbide layer is p-type doped to form a PN junction with n-type silicon substrate, a dopant of the silicon oxycarbide layer includes boron, wherein the atomic percentage of carbon in the silicon oxycarbide layer is equal to or greater than 7 times the atomic percentage of oxygen in the silicon oxycarbide layer.

* * * * *